(12) United States Patent
Tonkikh

(10) Patent No.: US 11,031,526 B2
(45) Date of Patent: Jun. 8, 2021

(54) SEMINCONDUCTOR CHIP HAVING INTERNAL TERRACE-LIKE STEPS AND METHOD FOR PRODUCING A SEMICONDUCTOR CHIP

(71) Applicant: OSRAM OLED GmbH, Regensburg (DE)

(72) Inventor: Alexander Tonkikh, Wenzenbach (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/624,312

(22) PCT Filed: May 17, 2018

(86) PCT No.: PCT/EP2018/062978
§ 371 (c)(1),
(2) Date: Dec. 19, 2019

(87) PCT Pub. No.: WO2018/233950
PCT Pub. Date: Dec. 27, 2018

(65) Prior Publication Data
US 2020/0168764 A1    May 28, 2020

(30) Foreign Application Priority Data
Jun. 19, 2017   (DE) ..................... 10 2017 113 383.6

(51) Int. Cl.
*H01L 33/20* (2010.01)
*H01L 33/00* (2010.01)
(Continued)

(52) U.S. Cl.
CPC .......... *H01L 33/20* (2013.01); *H01L 33/0062* (2013.01); *H01L 33/16* (2013.01);
(Continued)

(58) Field of Classification Search
CPC ..... H01L 33/0075; H01L 33/14; H01L 33/16; H01L 33/20; H01L 33/30; H01L 33/0062;
(Continued)

(56) References Cited

U.S. PATENT DOCUMENTS

| 4,912,533 A | 3/1990 | Takahashi |
| 5,583,878 A | 12/1996 | Shimizu et al. |

(Continued)

FOREIGN PATENT DOCUMENTS

| DE | 19538805 A1 | 4/1996 |
| DE | 102012022929 A1 | 6/2013 |

(Continued)

OTHER PUBLICATIONS

International Search Report based on Application No. PCT/EP2018/062978 (4 pages), dated Jul. 17, 2018.

(Continued)

*Primary Examiner* — Savitri Mulpuri
(74) *Attorney, Agent, or Firm* — Viering, Jentschura & Partner MBB

(57) ABSTRACT

A semiconductor chip may include a semiconductor body, a current spreading layer, and a contact structure. The semiconductor body may include a first semiconductor layer, a second semiconductor layer, and an intervening active layer, and a current spreading layer arranged in a vertical direction between the contact structure and the semiconductor body. The semiconductor boy has a plurality of internal step configured in a terrace-like manner where the contact structure may include a plurality of conductor tracks arranged with regard to the lateral orientations of the internal step in such a way that current spreading along the internal steps is promoted vis-à-vis current spreading transversely with respect to the internal steps. A method for producing the semiconductor chip is also included.

17 Claims, 5 Drawing Sheets

(51) Int. Cl.
*H01L 33/16* (2010.01)
*H01L 33/30* (2010.01)
*H01L 33/38* (2010.01)

(52) U.S. Cl.
CPC .............. *H01L 33/30* (2013.01); *H01L 33/38* (2013.01); *H01L 2933/0016* (2013.01)

(58) Field of Classification Search
CPC ......... H01L 33/24; H01L 33/38; H01L 33/32; H01L 2933/0016
See application file for complete search history.

(56) References Cited

U.S. PATENT DOCUMENTS

| | | | |
|---|---|---|---|
| 5,818,073 A | | 10/1998 | Ochi et al. |
| 6,356,572 B1 * | | 3/2002 | Tanaka ................... B82Y 20/00 257/15 |
| 10,896,818 B2 * | | 1/2021 | Han ........................ C30B 33/10 |
| 2012/0299061 A1 * | | 11/2012 | Momoi ............. H01L 21/02392 257/190 |
| 2013/0049043 A1 | | 2/2013 | Schubert et al. |
| 2013/0187124 A1 | | 7/2013 | Zhang et al. |
| 2013/0221394 A1 | | 8/2013 | Huang et al. |
| 2014/0131723 A1 | | 5/2014 | Hawryluk et al. |
| 2014/0158983 A1 * | | 6/2014 | Pernot ..................... H01L 33/06 257/13 |
| 2015/0053996 A1 * | | 2/2015 | Narita .................. H01L 29/2003 257/76 |
| 2018/0261725 A1 * | | 9/2018 | Kaneda ................... H01L 33/16 |

FOREIGN PATENT DOCUMENTS

| | | |
|---|---|---|
| EP | 2398075 A1 | 12/2011 |
| JP | 2006-060164 A1 | 3/2006 |

OTHER PUBLICATIONS

German Search Report based on Application No. 10 2017 113 383.6 (9 pages), dated Mar. 6, 2018.

Hu et al.: "Optical gain anisotropy in serpentine superlattice nanowire-array lasers", Appl. Phys. Lett. 63; 1993; 4 pages.

Norman et al.: "Nature and origin of atomic ordering in III-V semiconductor alloys", Inst. Phys. Conf. Ser. No. 134; 1993; pp. 279-290.

* cited by examiner

SEMINCONDUCTOR CHIP HAVING INTERNAL TERRACE-LIKE STEPS AND METHOD FOR PRODUCING A SEMICONDUCTOR CHIP

CROSS-REFERENCE TO RELATED APPLICATIONS

The present application is a national stage entry according to 35 U.S.C. § 371 of PCT application No.: PCT/EP2018/062978 filed on May 17, 2018; which claims priority to German Patent Application Serial No.: 10 2017 113 383.6, which was filed on Jun. 19, 2017; both of which are incorporated herein by reference in their entirety and for all purposes.

TECHNICAL FIELD

A semiconductor chip is specified. Furthermore, a method for producing a semiconductor chip or a plurality of semiconductor chips is specified.

BACKGROUND

During epitaxial growth of a compound semiconductor material on a growth substrate, for example of a III-V semiconductor material such as InGaAlP on GaAs, the so-called atomic CuPt-arrangement can occur. This type of atomic arrangement usually results in reduced bandgap, reduced band-offset and/or optical anisotropy and is therefore undesirable in many cases.

SUMMARY

One object is to specify an efficient semiconductor chip. Furthermore, a simplified method for producing one or a plurality of such semiconductor chips is specified.

According to at least one embodiment of a semiconductor chip, it has a semiconductor body. The semiconductor body has a first semiconductor layer, a second semiconductor layer and an active layer arranged vertically between the first semiconductor layer and the second semiconductor layer.

A vertical direction is generally understood to be a direction directed transversely, in particular perpendicularly, to a main extension surface of the semiconductor body. The vertical direction is for instance a growth direction of the semiconductor body. A lateral direction, on the other hand, is understood to be a direction that runs along, in particular parallel to the main extension surface of the semiconductor body. The vertical direction and the lateral direction are perpendicular to each other.

The first semiconductor layer and the second semiconductor layer can be n-conductive and p-conductive, respectively, or vice versa. During operation of the semiconductor chip, the active layer is especially configured to emit or detect electromagnetic radiation in the visible, ultraviolet or infrared spectral range. In particular, during operation of the semiconductor chip, the active layer emits electromagnetic radiation having a peak wavelength between 480 nm and 660 nm inclusive, for instance between 500 nm and 660 nm inclusive, or between 550 nm and 660 nm inclusive. For example, the active layer is a pn-junction zone. The active layer may have a quantum well layer structure, in particular with a plurality of quantum well layers. In particular, the semiconductor chip is a light-emitting diode (LED).

According to at least one embodiment of the semiconductor chip, the semiconductor body has a plurality of internal steps, which are formed for instance in a terrace-like manner. In particular, the semiconductor body includes a plurality of sublayers, each of which has a multi-step terrace-like geometric shape. In each case, the sublayers may be a monolayer made of the semiconductor material or have a plurality of monolayers, for instance between 2 and 20 monolayers inclusive, or between 2 and 10 monolayers inclusive. In other words, the internal steps and the sublayers including the internal steps may be formed as mono-atomic or multi-atomic steps or sublayers. A layer thickness of the sublayer of the semiconductor body is given in particular by a vertical height of the associated step. The thickness of the sublayer may be between 2 nm and 2000 nm inclusive, for instance between 2 nm and 200 nm or between 2 nm and 20 nm, or between 20 nm and 2000 nm inclusive, for instance between 20 nm and 200 nm.

The internal terrace-like steps can be results in particular of the growth of the semiconductor material on a growth substrate having a vicinal surface. A vicinal surface is understood to be a surface whose orientation deviates from a low-indexed surface by a small angle, the so-called offcut or offcut angle. In case of a substrate having a vicinal surface, the normal of the macroscopic surface is tilted in particular by the offcut angle against the normal of a low-indexed surface. For example, the low-indexed surface is a (100) or (001) crystal surface. The offcut angle can be between 2° and 15° inclusive or between 4° and 15° inclusive, for instance between 6° and 10° inclusive.

If the semiconductor body is formed on such a growth substrate, this may lead to the formation of internal steps, wherein the internal steps have directed terraces, in particular parallel terraces, separated by step transitions. For example, the semiconductor body is based on InGaAlP, AlGaAs or InGaAlAs. The material of the semiconductor body can be epitaxially grown on a GaAs substrate or on an InP substrate having a (001) or (100) vicinal surface and a offcut angle between 2° and 15° inclusive. In general, the semiconductor body and/or the growth substrate may be based on a III-V semiconductor material.

It has been found that the undesirable effects associated with the atomic CuPt-type-arrangement can be reduced if the semiconductor body is produced on a growth substrate having a vicinal surface. However, the growth of the semiconductor body on such a substrate can lead to the formation of internal steps, wherein potential barriers are formed at the steps or at the step transitions, which can hamper the lateral current expansion and thus the charge transport. Such potential barriers are formed in particular at the heterojunctions between adjacent sublayers of the semiconductor bodies, especially on the same vertical plane.

Due to the presence of the internal steps, current expansion or current propagation in lateral directions occurs anisotropically. In a lateral direction along the steps, the charge carriers can move essentially unhindered, since the charge carriers may be maintained essentially on the same terrace. In lateral directions transverse or perpendicular to the steps, the charge carriers have to overcome the potential barriers formed at the step transitions. In order to achieve an effective lateral current expansion, the semiconductor chip can have one or more current expansion layers and in particular one or more structured contact structures.

According to at least one embodiment of the semiconductor chip, it has a current expansion layer and a contact structure. The current expansion layer is arranged in the vertical direction, for example, between the contact structure and the semiconductor body. In particular, the contact structure is arranged directly on the current expansion layer and is in direct electrical contact with it. For instance, the current expansion layer adjoins the semiconductor body.

In particular, the contact structure has a plurality of conductor tracks which regarding their lateral orientations, are formed with regard to the lateral orientations of the internal steps in such a way that the current expansion and/or the current propagation along the internal steps is/are favored over the current expansion and/or the current propagation transverse or perpendicular to the internal steps.

In a plan view of the semiconductor body, the conductor tracks can be oriented parallel to each other within the production tolerances. In general, the lateral propagation of the charge carriers outside the conductor tracks and within the current expansion layer occurs along a direction perpendicular to the parallel conductor tracks. Within the semiconductor body, the same lateral expansion direction or direction of propagation of the charge carriers is stimulated.

If the expansion direction or the propagation direction is essentially parallel to a main direction of extension of the steps or if this deviates only slightly from the main direction of extension of the steps, the charge carriers encounter no or comparatively only a few of potential barriers at the step transitions, so that a lateral propagation of charge carriers on the same plane is realized in an effective manner. In other words, the propagation of the charge carriers within the current expansion layer and within the semiconductor body can be enhanced along the internal steps by targeted alignment of the conductor tracks with respect to the main direction of extension of the steps. The propagation of the charge carriers along a direction transverse to the steps or along a direction throughout the potential barriers is thus reduced. In overall, the forward voltage of the semiconductor chip in particular having a diode structure can be effectively reduced, resulting in an increasing efficiency of the semiconductor chip.

According to at least one embodiment of the semiconductor chip, the contact structure has a connection area and at least one connection bar. The semiconductor chip can be electrically contacted externally via the connection area. For example, a bonding wire can be attached to the connection area. The connection bar is for instance in direct electrical contact with the connection area. The conductor tracks can be electrically connected to each other via the connection bar. For example, the connection bar is arranged on the periphery of the current expansion layer, wherein the conductor tracks extend from the connection bar over a central area to an edge area of the current expansion layer opposite to the connection bar.

In at least one embodiment of a semiconductor chip, it has a semiconductor body, a current expansion layer and a contact structure. The semiconductor body includes a first semiconductor layer, a second semiconductor layer and an active layer located therebetween. The current expansion layer is arranged in the vertical direction between the contact structure and the semiconductor body. The semiconductor body has a plurality of internal steps formed in a terrace-like manner. The contact structure has a plurality of conductor tracks which regarding to their lateral orientations, are arranged with regard to the lateral orientations of the internal steps in such a way that a current expansion along the internal steps is favored over a current expansion transverse to the internal steps.

According to at least one embodiment of the semiconductor chip, in a plan view of the semiconductor body, the conductor tracks in each case overlap with several of the internal terrace-like steps. In a plan view, the conductor tracks can partially cover a plurality of the internal terrace-like steps. In other words, each of the conductor tracks can extend over several internal steps in a plan view.

The conductor tracks and the current expansion layer can have different materials, wherein the material of the conductor tracks has a higher electrical conductivity than a material of the current expansion layer. For example, the contact structure having the conductor tracks is made from a metal or from different metals. In a non-limiting embodiment, the conductor tracks cover at most 30%, at most 20%, for example at most 10% or at most 5% of the current expansion layer and/or of a radiation exit surface of the semiconductor chip.

According to at least one embodiment of the semiconductor chip, in a plan view of the semiconductor body, the respective conductor tracks, in particular all conductor tracks, overlap with at least 50%, 60%, 70%, 80% or with at least 90% of all internal terrace-like steps. The lateral main direction of extension of the internal steps and the lateral main direction of extension of the conductor tracks are transverse or perpendicular to each other.

In case of doubt, a main direction of extension of a step is understood to be a direction along which a step terrace, which, in particular, has a constant width within the production tolerances, has its greatest lateral extension. In case of doubt, a main direction of extension of a conductor track is understood to be a direction along which the conductor track has its greatest lateral extension.

According to at least one embodiment of the semiconductor chip, the conductor tracks are oriented parallel to one another and are electrically conductively connected to one another via a connection bar of the contact structure. In particular, in a plan view, the conductor tracks have an anisotropic distribution on the current expansion layer, for example with respect to a lateral direction along the steps and a lateral direction transverse or perpendicular to the steps. For example, the number of parallel conductor tracks is at least 5, 10, 20 or at least 50, for instance between 5 and 100.

In particular, in a plan view, the conductor tracks do not form an isotropic or essentially isotropic distribution which, for example, reproduces a circular, honeycomb or spider's web-like structure. An isotropic or nearly isotropic distribution of the conductor tracks does not lead to a significant enhancement of the lateral current expansion or current propagation along a specific lateral direction, namely the lateral direction along the internal steps within the semiconductor body. For example, the conductor tracks do not form a regular pattern with a rotational symmetry at an angle smaller than 180°, 120°, 90°, 60° or smaller than 30°.

According to at least one embodiment of the semiconductor chip, the internal steps are located along a first lateral direction on different vertical planes of the semiconductor body. The respective internal steps on each of the vertical planes can run along a main direction of extension, for instance along a second lateral direction, wherein the first lateral direction and the second lateral direction are transverse or perpendicular to each other. Along the second lateral direction, the internal steps located on different vertical planes, can run parallel to each other.

According to at least one embodiment of the semiconductor chip, the internal steps have a common lateral main direction of extension. In a plan view of the semiconductor body, the respective conductor tracks, which in particular run parallel to each other, can intersect the common main direction of extension of the internal steps and form an angle of 90°+/−30°, in particular 90°+/−20°, for instance 90°+/−10° or 90°+/−5° therewith.

According to at least one embodiment of the semiconductor chip, it has a further contact structure including a plurality of further conductor tracks. The semiconductor body is arranged in the vertical direction in particular between the contact structure and the further contact structure. Regarding their lateral orientations, the further conductor tracks are arranged with regard to the lateral orientations of the internal steps in such a way that the current expansion along the internal steps is favored over the current expansion transverse to the internal steps.

According to at least one embodiment of the semiconductor chip, the conductor tracks and the further conductor tracks have lateral orientations which differ from each other by at most 30°, 20°, 10° or by at most 5°. In a plan view, the conductor tracks and the further conductor tracks can run parallel to each other within the production tolerances.

According to at least one embodiment of the semiconductor chip, the current expansion layer is a transparent electrically conductive layer. The current expansion layer, for example, is formed from a transparent electrically conductive oxide (TCO), in particular from indium tin oxide (ITO).

According to at least one embodiment of the semiconductor chip, the first semiconductor layer and the second semiconductor layer each have a semiconductor layer sequence including of a plurality of sublayers. The active layer may also have a plurality of sublayers. The sublayers can each reproduce a geometric shape of the internal terrace-like steps. For example, each of the sublayers may have one or several monolayers of the same material or of the same material composition. The number of monolayers may be between 1 and 20 inclusive, between 2 and 20 inclusive, for instance between 3 and 10 inclusive. The first semiconductor layer, the second semiconductor layer and/or the active layer may each have 1 to 10 such sublayers. The sublayers of the first semiconductor layer, the second semiconductor layer and the active layer may have different material compositions and/or be doped differently.

According to at least one embodiment of the semiconductor chip, the active layer has a multi-step terrace-like surface. The active layer may have a plurality of sublayers, which have a plurality of steps and in overall are formed in a terrace-like manner.

In at least one embodiment of a method for producing one or a plurality of semiconductor chips in particular described here, a substrate, such as a growth substrate based on a III-V semiconductor material, having a vicinal surface, in particular having a vicinal (100) or (001) surface, is provided. The vicinal surface has an offcut orientation, for example with an offcut angle between 2° and 15°. A semiconductor body is applied onto the substrate in layers, for example by an epitaxial process. The semiconductor body may have a plurality of sublayers, which are formed on the substrate in a terrace-like manner. The semiconductor body having the sublayers may have a plurality of steps, in particular a plurality of internal terrace-like steps.

A current expansion layer is applied onto the semiconductor body. In particular, the current expansion layer is formed from a radiation-transmissive and electrically conductive material. A contact structure including a plurality of conductor tracks is formed on the current expansion layer. In particular, the conductor tracks are applied onto the current expansion layer using a mask, in particular in a structured manner.

It is possible that the substrate may have steps due to offcut orientation. The internal steps of the semiconductor body can reproduce the steps of the substrate. For example, the substrate is a GaAs(100) vicinal substrate or an InP vicinal substrate. The semiconductor body can be based on InGaAlP, GaInAs, AlGaAs, InGaAlAs or InGaP.

According to at least one embodiment of the method, the mask is made from a photo-structurable material. The mask is structured and has, for example, a plurality of openings for the formation of the conductor tracks and/or the connection areas and/or the connection bars of the contact structure. The conductor tracks, the connection areas and/or the connection bars of the contact structure can be applied onto the current expansion layer in a structured manner using the mask.

According to at least one embodiment of the method, the substrate is removed from the semiconductor body. The semiconductor chip to be produced can therefore be free of a growth substrate. The current expansion layer can be applied prior to or after the removal of the substrate from the semiconductor body. In particular, the current expansion layer is formed after the removal of the substrate, wherein the current expansion layer is applied onto a surface of the semiconductor chip which is exposed by the process of removing the substrate.

The method described above is particularly suitable for producing one or a plurality of the semiconductor chips described above. The features described in connection with the semiconductor chip can therefore also be used for the method and vice versa.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

Figure 1A:
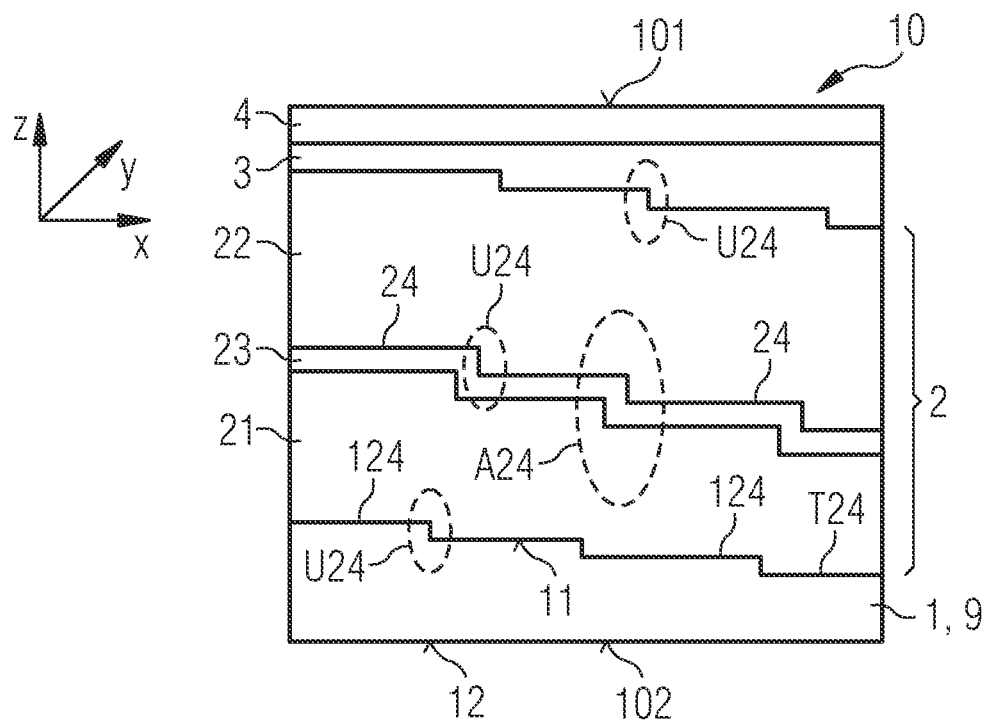
FIGS. 1A, 1B and 1C show schematic representations of a semiconductor chip according to a first embodiment.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION

Figure 1B:
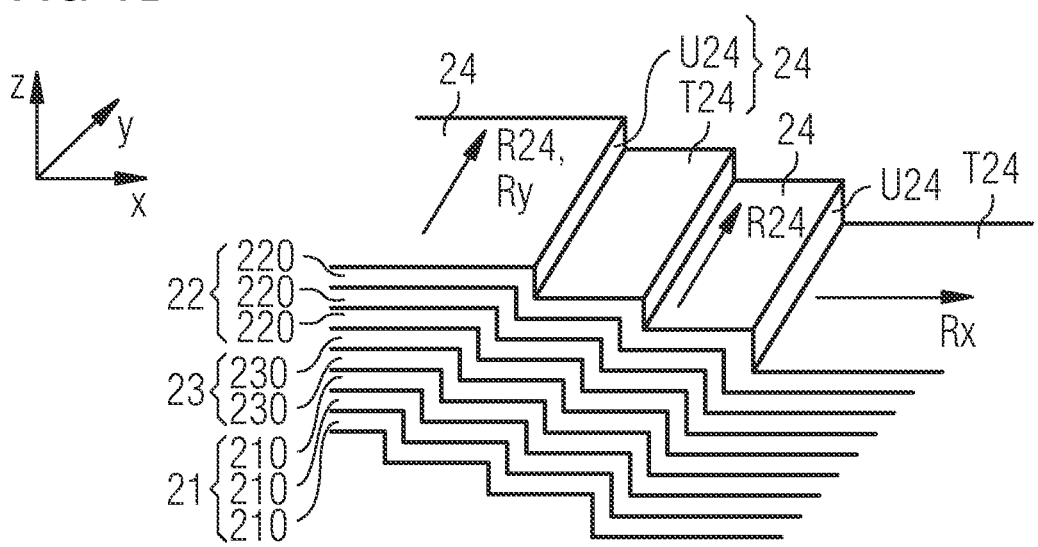

An example of a semiconductor chip 10 is shown schematically in FIGS. 1A and 1B in an xz-plane with x denoting a first lateral direction, such as a lateral transverse direction, and z denoting a vertical direction. Furthermore, y denotes a second lateral direction, such as a lateral longitudinal direction.

According to FIG. 1A, the semiconductor chip 10 includes a substrate 1 or a carrier 9, a semiconductor body 2 arranged thereon, a current expansion layer 3 and a contact structure 4. The substrate 1 can be a growth substrate on which the semiconductor body 2 is epitaxially grown. For example, the substrate 1 is a III-V semiconductor material substrate, such as a GaAs or InP substrate. Alternatively, the substrate 1 can be a carrier 9 that is different from a growth substrate. In this case, the semiconductor chip 10 can be free of a growth substrate. The carrier can be mechanically connected to the semiconductor body 2 by a bonding layer.

The substrate 1 has a front side 11 facing the semiconductor body 2 and a rear side 12 facing away from the semiconductor body 2. The front side 11 may have steps 124. In particular, steps 124 are due to the offcut orientation of the front side 11. For example, the substrate has a vicinal surface with an offcut angle of for instance between 2° and 15° inclusive, in particular between 5° and 10° inclusive, between 7° and 9° inclusive. In particular, the rear side 12 is flat and may be free of edges or steps.

The semiconductor chip 10 has a front side 101 and a rear side 102. The front side 101 is formed for instance by a surface of the current expansion layer 3 and/or of the contact structure 4. For example, the front side 101 is a radiation passage surface, especially a radiation exit surface of the semiconductor chip 10. The rear side 102 of the semiconductor chip 10 can be formed by the rear side 12 of the substrate 1 or of the carrier 9.

The current expansion layer 3 is made of a radiation-transmissive and electrically conductive material such as a transparent and electrically conductive oxide (TCO). In particular, the contact structure 4 covers the current expansion layer 3 only partially. The contact structure 4 is for instance a front side contact structure.

The semiconductor body 2 has a first semiconductor layer 21 facing the substrate 1, a second semiconductor layer 22 facing away from the substrate 1 and an optically active layer 23 arranged between the semiconductor layers 21 and 22. The semiconductor layers 21 and 22 can be n- and p-conductive, respectively, and also n- and p-doped, respectively, or vice versa. In particular, the semiconductor layers 21 and/or 22 and/or the active layer 23 may be formed from several sublayers 210, 220 or 230 of the same or different material composition and/or doping, which are arranged one above the other in the vertical direction z. In a non-limiting embodiment, the active layer 23 is configured for generating electromagnetic radiation. For example, the semiconductor body 2 includes or consists of a III-V semiconductor material.

The semiconductor body 2 has a plurality of internal steps 24. The steps 24 are especially terrace-like. Along a first lateral direction Rx, for instance along the lateral transverse direction x, or along an offcut orientation Rxz, the semiconductor body 2 may have between 10 and 200, for instance between 20 and 200, or between 40 and 200, for instance between 60 and 200, inclusive, of such internal steps 24. The internal steps 24 of semiconductor body 2 may reproduce the steps 124 of the substrate 1.

FIG. 1B shows a section A24 in the semiconductor body 2 marked in FIG. 1A in more detail.

Each of the internal steps 24 has a step terrace T24 and a step transition U24. The step terrace T24 is located in particular on a vertical plane of the semiconductor body 2 and extends along a main direction of extension R24, which is given in particular by a second lateral direction Ry, for instance by the lateral longitudinal direction y. Each of the sublayers 210, 220 and/or 230 may have a plurality of step terraces T24 arranged along the lateral transverse direction x on different vertical planes of the semiconductor body 2 and each having a main direction of extension R24 along the lateral longitudinal direction y. The step transitions U24 in each case extend along the vertical direction z between two adjacent step terraces T24 of the sublayers 210, 220 or 230.

Due to the internal steps 24, potential barriers are formed at the step transitions U24, which hamper a lateral in-plane current spreading within the same vertical plane of semiconductor body 2. The reason for this is that the charge carriers have to overcome the potential barriers formed at the heterojunctions between the adjacent sublayers 210, 220 or 230 during lateral current spreading. The charge transport along the lateral transverse direction x or Rx is thus significantly more lossy than the charge transport along the lateral longitudinal direction y or along the main direction of extension R24 of the internal steps 24.

Figure 1C:
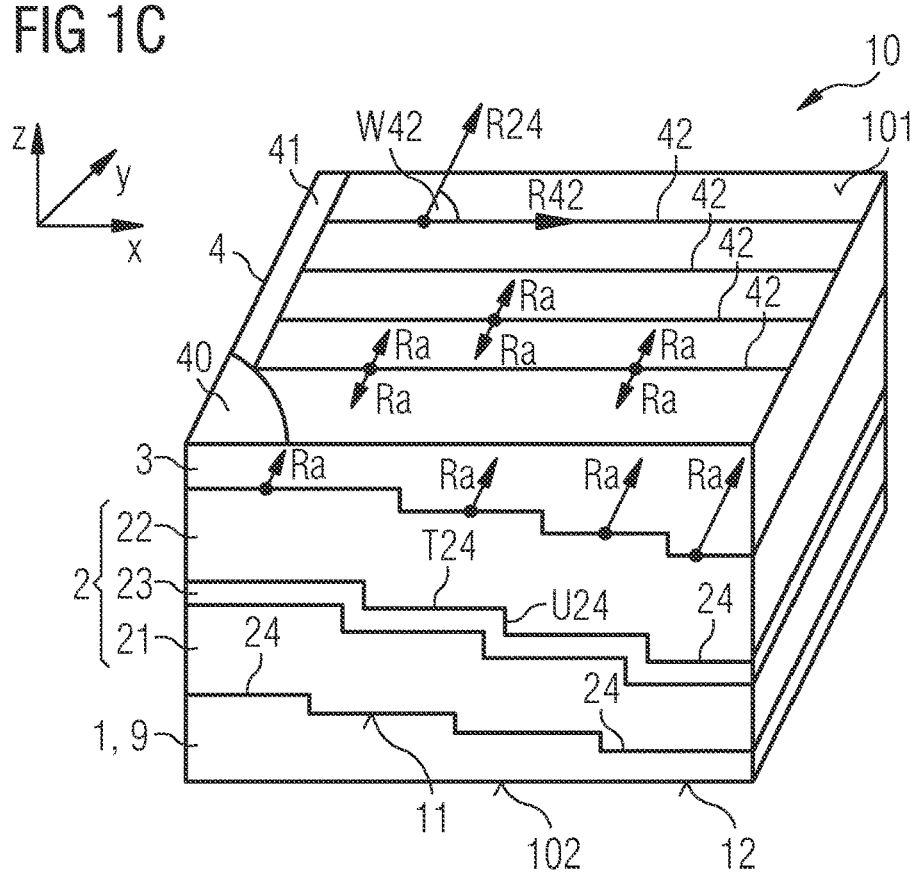

The embodiment of a semiconductor chip 10 shown in FIG. 1C corresponds to the embodiment shown in FIG. 1A. In contrast to FIG. 1A, the semiconductor chip 10 is also shown along the lateral longitudinal direction y.

On the current expansion layer 3, the contact structure 4 has a connection area 40, a connection bar 41 and a plurality of conductor tracks 42. The semiconductor chip 10 can be electrically contacted externally via the connection area 40. The conductor tracks 42 can be electrically connected to each other via the connection bar 41. In FIG. 1C, the connection area 40 is arranged at the edge. Apart from this, the connection area 40 can also be arranged centrally on the current expansion layer 3. The contact structure 4 can have a plurality of connection bars 41 which are arranged on the edge of the current expansion layer 3 or lead away from a centrally arranged connection area 40.

Along the lateral transverse direction x, the conductor tracks 42 are directed parallel to each other. In a plan view of the front side 101, the conductor tracks 42 overlap a plurality of the underlying internal steps 24, in particular at least 70% of the underlying internal steps 24.

FIG. 1C schematically shows the current expansion directions Ra extending from the conductor tracks 42 to the surrounding area. The current expansion directions Ra are essentially perpendicular to the main directions of extension R42 of the conductor tracks 42. Starting from the conductor tracks 42, which in particular are parallel to each other, the charge carriers spread mainly along the internal steps 24, i.e. along the lateral longitudinal direction y. Along the lateral longitudinal direction y, there are no or essentially no potential barriers hindering the charge carriers, so that a lateral current expansion in the current expansion layer 3 and in the semiconductor body 2 can be effectively achieved. A particular lossy propagation of the charge carriers along the lateral transverse direction x is thus suppressed. In this sense, the current expansion along the internal steps 24, i.e. along the lateral longitudinal direction y, is enhanced or favored compared to current expansion transverse to the internal steps 24, i.e. along the lateral transverse direction x.

FIG. 1C shows that the internal steps 24 have a common lateral main direction of extension R24. In a plan view of the semiconductor body 2, the main directions of extension R42 of the conductor tracks 42 form an angle W42 with the common main direction of extension R24 of the internal steps 24, which is between 60° and 120°. In a non-limiting embodiment, the angle W42 is thus 90° with a deviation of at most 30°, 20°, 10° or 5°.

Figure 1D:
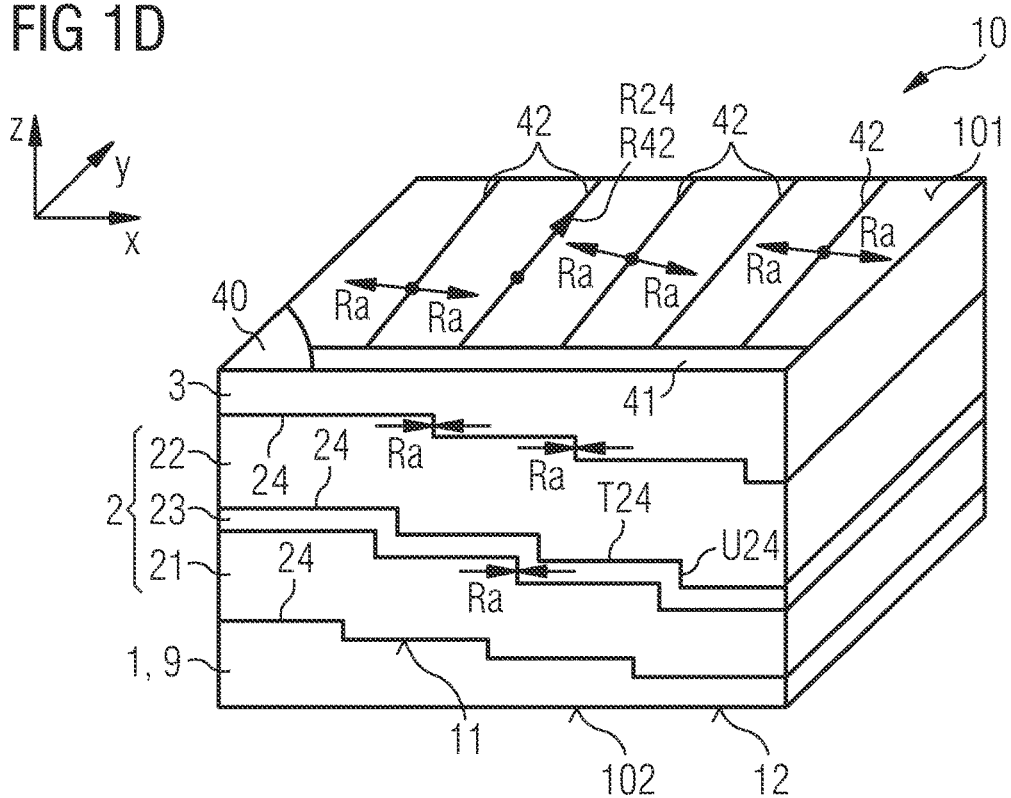
FIG. 1D shows a schematic representation of a semiconductor chip according to a comparison example.

A comparison example of a semiconductor chip 10 is schematically shown in FIG. 1D, wherein both the step terraces T24 and the conductor tracks 42 are oriented along the lateral longitudinal direction y. In this case, the current expansion direction Ra is transverse or perpendicular to the main direction of extension R24 of the respective steps 24. The current expansion direction Ra is thus oriented along the lateral transverse direction x or along the offcut orientation Rxz. As a result, the charge carriers have to overcome a plurality of potential barriers at the heterojunctions during their lateral propagation on the same vertical plane. It has been found that the forward voltage of the semiconductor chip 10 shown in FIG. 1C is significantly reduced compared to the forward voltage of the semiconductor chip 10 shown in FIG. 1D. If the forward voltage is reduced, the efficiency of the semiconductor chip 10 is again increased.

Figure 2A:
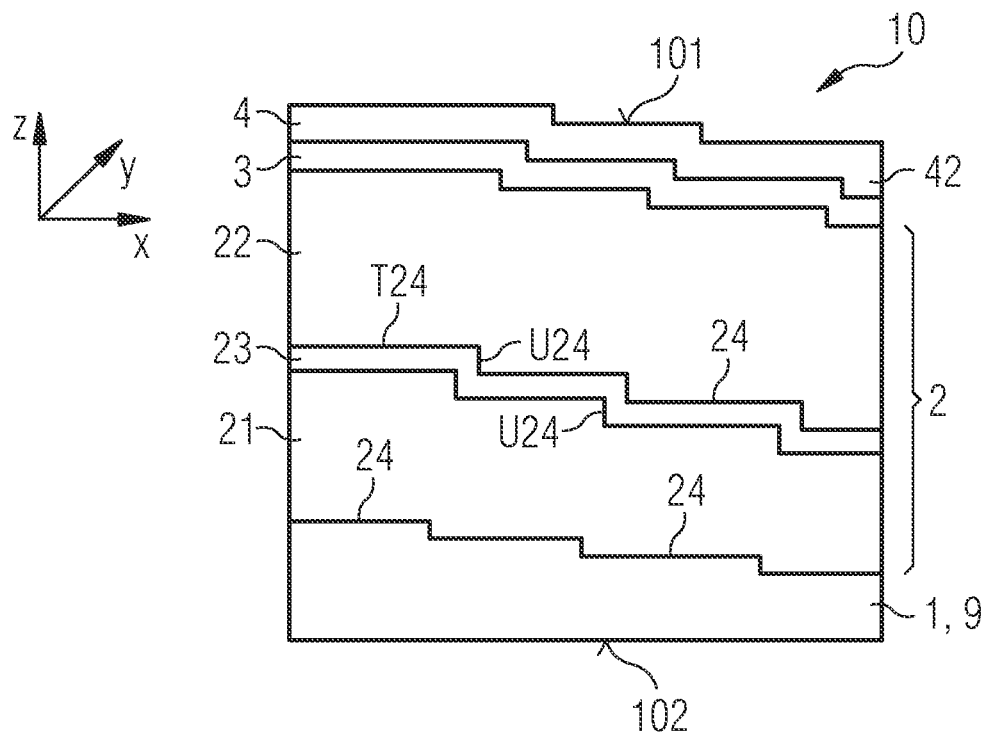
FIGS. 2A, 2B, 2C and 2D show schematic representations of other semiconductor chip embodiments.

The embodiment of a semiconductor chip 10 shown in FIG. 2A essentially corresponds to the embodiment shown in FIG. 1A. In FIG. 1A, the current expansion layer 3 has a surface facing the contact structure 4 which is essentially flat. The conductor tracks 42 are thus arranged on a flat surface of the current expansion layer 3. In contrast to this, the conductor tracks 42 and/or the current expansion layer 3 show a multi-step terrace-like shape along the lateral transverse direction x or along the offcut orientation Rxz of the semiconductor body 2. The front side 101 of the semiconductor chip 10 can be formed by a multi-step terrace-like surface.

Figure 2B:
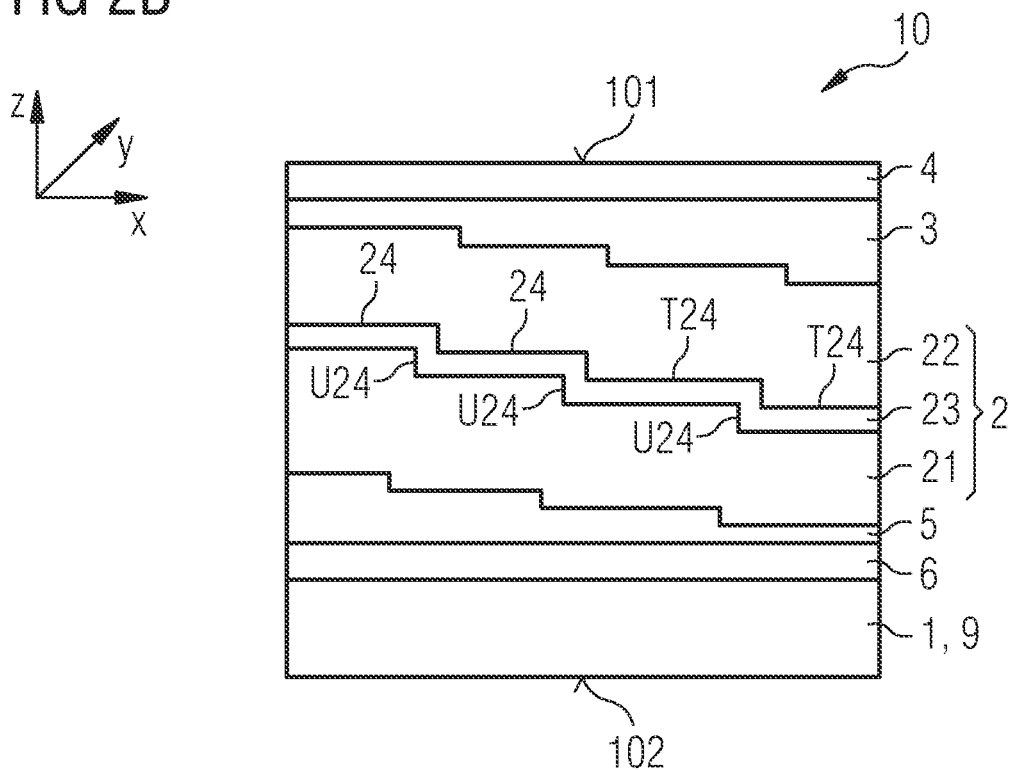

The embodiment of a semiconductor chip 10 shown in FIG. 2B essentially corresponds to the embodiment shown in FIG. 1A. In contrast to this, the semiconductor chip 10 has a further current expansion layer 5. In addition, the semiconductor chip 10 may have a further contact structure 6, such as a rear side contact structure 6. The semiconductor body 2 is located particularly between the current expansion layer 3 and the further current expansion layer 5.

It is possible that the further current expansion layer 5 is formed to be radiation reflecting. In particular, the further current expansion layer 5 may have a degree of reflectance of at least 60%, 70%, 80% or of at least 90% with respect to the radiation generated in the active layer. In particular, the semiconductor chip 10 is free of a growth substrate and is mechanically supported by the carrier 9. In particular, the carrier 9 is only attached to the semiconductor body 2 after the formation of the further current expansion layer 5 and/or of the further contact structure 6.

The further current expansion layer 5 and the further contact structure 6 can also be formed completely analogously to the current expansion layer 3 and the further contact structure 4, respectively. In a plan view, the current expansion layer 3 and/or the further current expansion layer 5 may completely cover the semiconductor body 2.

Figure 2C:
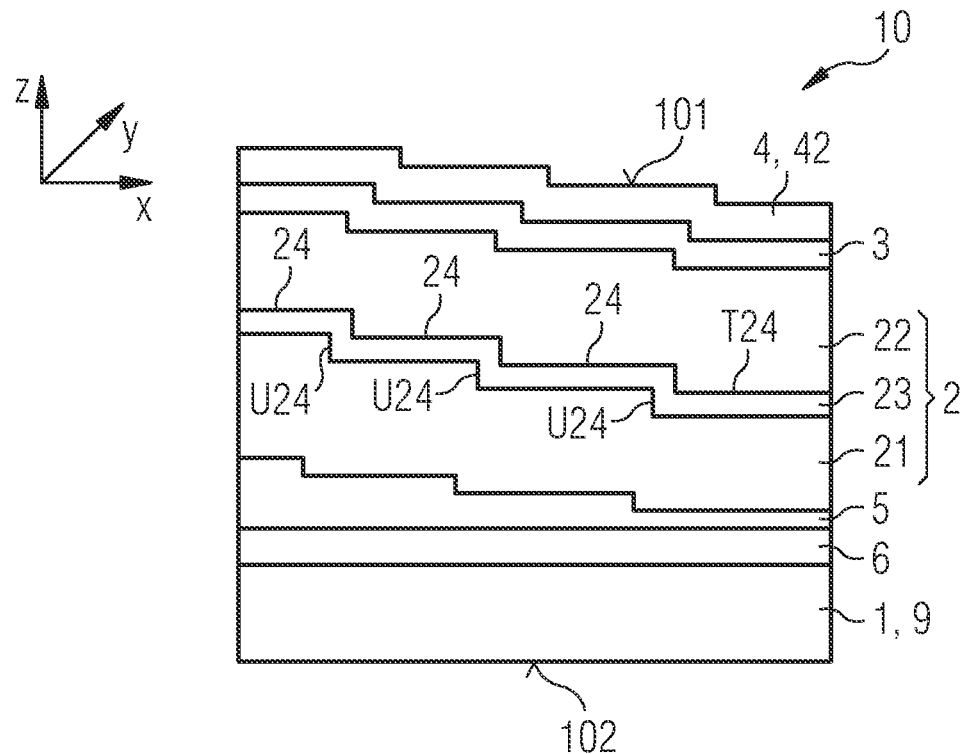

The embodiment of a semiconductor chip 10 shown in FIG. 2C essentially corresponds to the embodiment shown in FIG. 2B. In contrast to this, the current expansion layer 3 and the conductor tracks 42 are formed analogously to the current expansion layer 3 shown in FIG. 2A and analogously to the conductor tracks 42 shown in FIG. 2A, respectively.

Figure 2D:
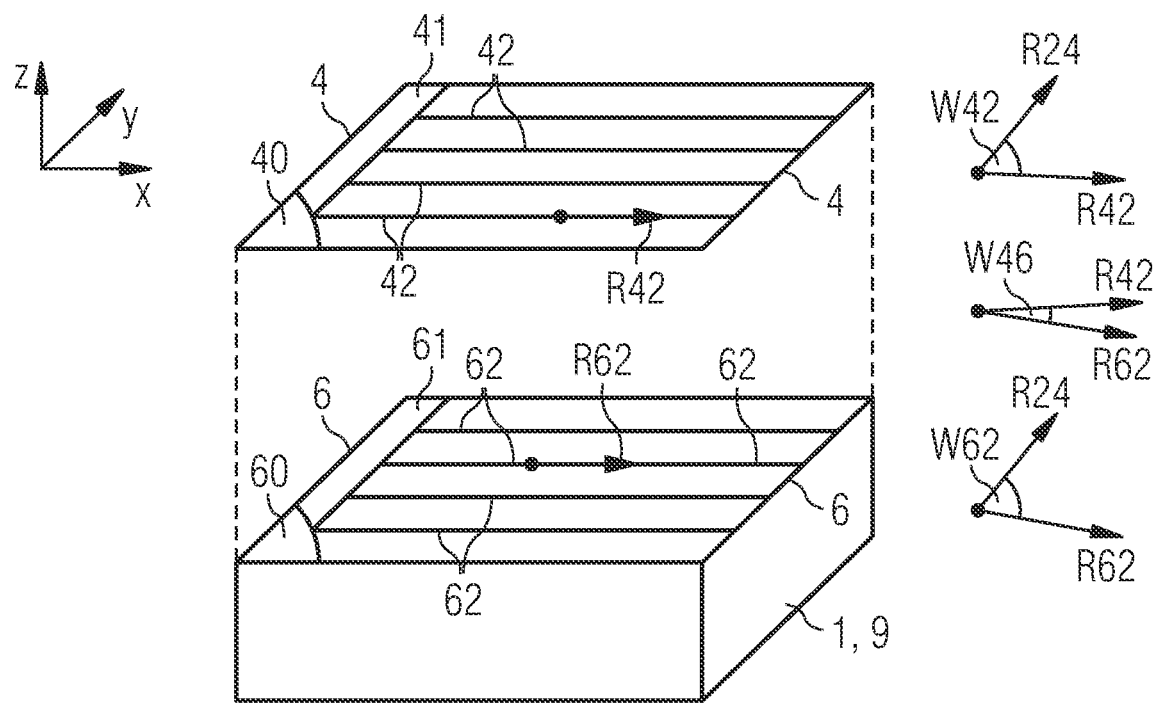

The embodiment of a semiconductor chip 10 shown in FIG. 2D corresponds in particular to the embodiment shown in FIG. 2B, wherein the further contact structure 6 is shown in more detail.

The further contact structure 6 has a further connection area 60, a further connection bar 61 and a plurality of further conductor tracks 62. The further conductor tracks 62 in each case have a main direction of extension R62 which is particularly parallel or essentially parallel to the lateral transverse direction x. Thus the further conductor tracks 62 are arranged with regard to their lateral orientations in relation to the lateral orientations of the internal steps 24 in such a way that a current expansion along the internal steps 24, namely along the lateral longitudinal direction y, is favored or enhanced in comparison to a current expansion transverse to the internal steps 24, i.e. along the lateral transverse direction x.

In a plan view of the semiconductor body 2, the main direction of extensions R62 of the further conductor tracks 62 can each form an angle W62 with the main direction of extension R24 of the internal steps 24, which is 90° with a deviation of at most 30°, 20°, 10° or 5°.

The conductor tracks 42 and the further conductor tracks 62 may have lateral orientations which differ from each other by at most 30°. For example, in a plan view, a common main extension direction R62 of the further conductor tracks 62 and the common main extension direction R42 of the conductor tracks 42 form an acute angle W46 which, in particular, is smaller than 30°, 20°, 10° or smaller than 5°.

Figure 3A:
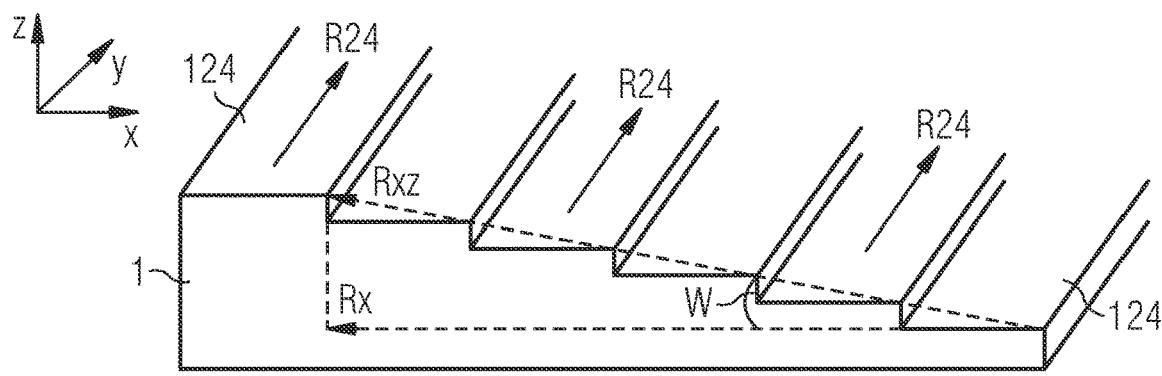
FIGS. 3A, 3B, 3C and 3D show schematic representations of a vicinal growth substrate and some method stages for producing one or more semiconductor chips on such a growth substrate.

FIG. 3A shows the substrate 1 for instance prior to the formation of the semiconductor body 2. The substrate 1 is a growth substrate having a vicinal surface. Along the offcut orientation Rxz, the substrate 1 has a plurality of steps 124. The steps 124 show on each vertical terrace plane xy, i.e. with constant z-coordinate, a main direction of extension R24 which is directed parallel in particular to the lateral longitudinal direction y. The macroscopic angle of inclination W schematically shown in FIG. 3A is determined in particular by the offcut angle or, in an ideal case, by the offcut angle.

Figure 3B:
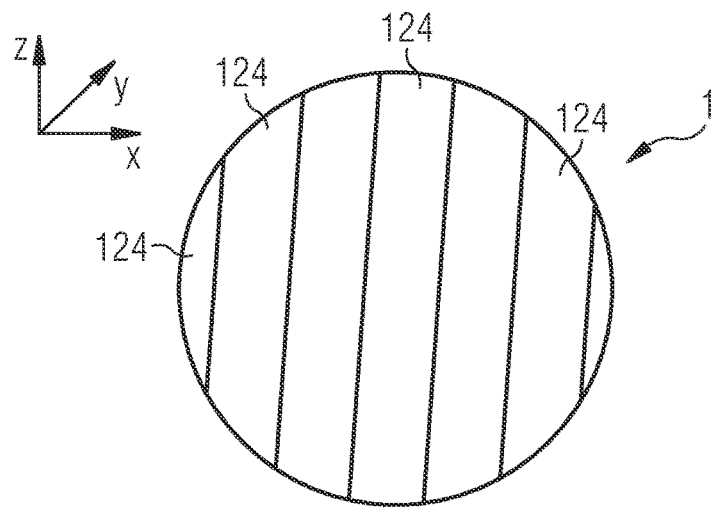

FIG. 3B shows the substrate 1 in a plan view. In particular, the substrate 1 is a wafer substrate for producing one or a plurality of the semiconductor chips 10. Using an epitaxial process, a semiconductor layer sequence can be applied onto the substrate 1 to form the semiconductor body 2.

Figure 3C:
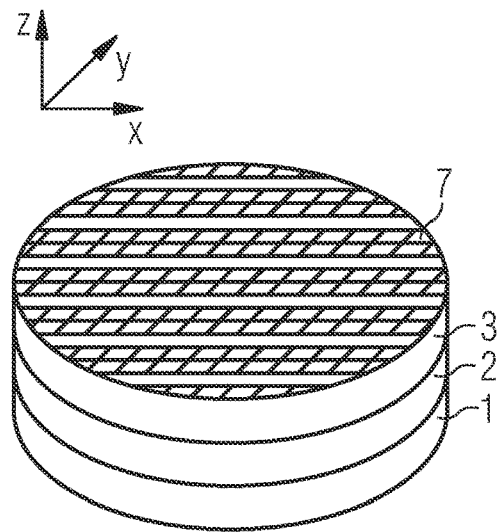
Figure 3D:
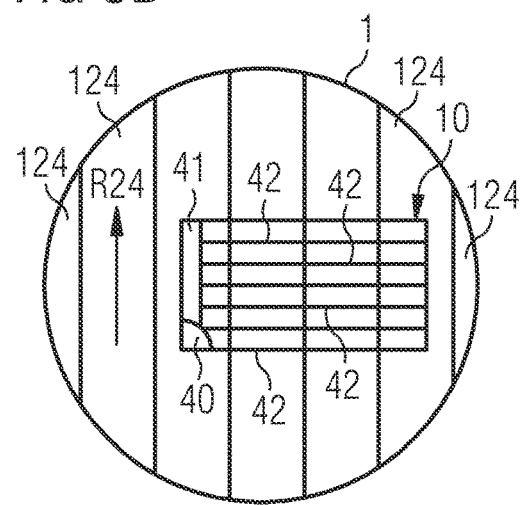

A mask 7 can be placed on the current expansion layer 3 or 5 to form a plurality of conductor tracks 42 or 62 (FIG. 3C). In particular, the mask 7 has a plurality of apertures oriented in particular transversely or perpendicularly to the steps 124 of the substrate 1. Using the mask 7, the conductor tracks 42 or 62 having predetermined orientations with respect to the orientation of the internal steps 24 of semiconductor body 2 can be formed in a simplified manner (FIG. 3D). To form a plurality of semiconductor chips 10, the semiconductor body 2 having the contact structures 4 and/or 6 arranged on it can be singulated.

The semiconductor chip 10 described here has a semiconductor body 2 including a plurality of internal steps 24 in the atomic range, wherein the internal steps 24 are form in particular due to the growth of the semiconductor body 2 on a vicinal growth substrate 1 tilted with respect to a crystal surface. Due to the presence of the internal steps 24, potential barriers are formed at the step transitions U24, which hamper the lateral current expansion in directions transverse to the internal steps 24. By forming a contact structure 4 in a targeted manner, a local current expansion or a local current propagation along a lateral direction without the potential barriers can be enhanced compared to a local current expansion or a local current propagation along the lateral direction with the potential barriers, as a result of which the forward voltage of the semiconductor chip 10 in overall is reduced. This improves the efficiency of the semiconductor chip 10.

This application claims the priority of the German patent application 10 2017 113 383.6, the disclosure content of which is hereby included by reference.

The invention is not restricted to the embodiments by the description of the invention made with reference to embodiments. The invention rather includes any novel feature and any combination of features, including in particular any combination of features in the claims, even if this feature or this combination is not itself explicitly indicated in the patent claims or embodiments.

LIST OF REFERENCE NUMERALS

10 Semiconductor chip
101 Front side of the semiconductor chip/Radiation exit surface
102 Rear side of the semiconductor chip Substrate/Growth substrate
11 Front side of the substrate
12 Rear side of the substrate
124 Step of the substrate
2 Semiconductor bodies
21 First semiconductor layer
210 Sublayers of the first semiconductor layer
22 Second semiconductor layer
220 Sublayers of the second semiconductor layer
23 Active layer
230 Sublayers of the active semiconductor layer
24 Internal step
3 Current expansion layer
4 Contact structure/Front side contact structure
40 Connection area
41 Connection bar
42 Conductor tracks
5 Further current expansion layer
6 Further contact structure/Rear side contact structure
60 Further connection area
61 Further connection bar
62 Further conductor tracks
7 Mask
9 Substrate/Carrier
A24 Section of the internal steps
U24 Step transition
T24 Step terrace
x First lateral direction/lateral transverse direction
y Second lateral direction/lateral longitudinal direction
z Vertical direction
Rx Lateral transverse direction of the step
Ry Lateral longitudinal direction of the step
Rxz Offcut orientation
R42 Main direction of extension of the conductor tracks
R62 Main direction of extension of the further conductor tracks
R24 Main direction of extension of the steps
Ra Current expansion direction
W42 Angle between the main direction of extensions of the steps and the conductor tracks
W46 Angle between the conductor track and the further conductor track
W62 Angle between the main direction of extensions of the steps and the further conductor tracks
W Angle of inclination/Offcut angle

The invention claimed is:

1. A semiconductor chip comprising:
a semiconductor body comprising a first semiconductor layer, a second semiconductor layer, and an active layer located therebetween;
a current expansion layer disposed in a vertical direction between a contact structure and the semiconductor body; and
the contact structure;
wherein the semiconductor body has a plurality of internal steps formed in a terrace structure; and
wherein the contact structure comprises a plurality of conductor tracks, wherein regarding their lateral orientations, the conductor tracks are arranged with regard to the lateral orientations of the internal steps in such a way that a current expansion along the internal steps is favored over a current expansion transverse to the internal steps.

2. The semiconductor chip according to claim 1, wherein in a plan view of the semiconductor body, the conductor tracks in each case overlap with a plurality of the internal terrace steps.

3. The semiconductor chip according to claim 1, wherein in a plan view of the semiconductor body, the conductor tracks in each case overlap with at least 50% of all internal terrace steps.

4. The semiconductor chip according to claim 1, wherein the conductor tracks are oriented parallel to one another and are electrically conductively connected to one another via a connection bar.

5. The semiconductor chip according to claim 1, wherein the internal steps are located along a first lateral direction on different vertical planes of the semiconductor body, wherein the internal steps on the different vertical planes run parallel to each other along a second lateral direction, and
wherein the first lateral direction and the second lateral direction are transverse or perpendicular to each other.

6. The semiconductor chip according to claim 1, wherein the internal steps have a common lateral main direction of extension, wherein in a plan view of the semiconductor body, the conductor tracks in each case intersect the common main direction of extension and form an angle of 90°+/−30° therewith.

7. The semiconductor chip according to claim 1, further comprising a further contact structure having a plurality of further conductor tracks, wherein
the semiconductor body is arranged in the vertical direction between the contact structure and the further contact structure, and
wherein the further conductor tracks are arranged with regard to the lateral orientations of the internal steps in such a way that the current expansion along the internal steps is favored over the current expansion transverse to the internal steps.

8. The semiconductor chip according to claim 7, wherein the conductor tracks and the further conductor tracks have lateral orientations which differ from one another by at most 30°.

9. The semiconductor chip according to claim 1, wherein the first semiconductor layer and the second semiconductor layer each have a semiconductor layer sequence comprising a plurality of sublayers, the sublayers in each case reproducing a geometric shape of the internal terrace steps.

10. The semiconductor chip according to claim 9, wherein each of the sublayers comprises a plurality of monolayers of the same material, wherein the number of monolayers ranges from 2 to 20.

11. The semiconductor chip according to claim 1, wherein the active layer has a multistep terrace surface.

12. The semiconductor chip according to claim 1, wherein the conductor tracks are arranged with respect to the lateral orientations of the internal steps in such a way that the current expansion within the current expansion layer and in the semiconductor body along the internal steps is favored over the current expansion transverse to the internal steps.

13. The semiconductor chip according to claim 1, wherein by targeted aligning the conductor tracks with respect to the main direction of extension of the steps within the current expansion layer and in the semiconductor body, the propagation of the charge carriers is enhanced along the internal steps, and the propagation of charge carriers along a direction transverse to the steps is reduced.

14. The semiconductor chip according to claim 1, which is a light emitting diode, wherein the semiconductor body is based on one or more of InGaAlP, GaInAs, AlGaAs, InGaAlAs, InGaP, or combinations thereof;

wherein the semiconductor body is arranged on a substrate comprising one or more of GaAs, InP, or both; and wherein the substrate has a vicinal surface which faces the semiconductor body and has an offcut ranging from 2° to 15° inclusive.

15. A method for producing a semiconductor chip according to claim 1, wherein the method comprises:

providing a substrate comprising a III-V semiconductor material having a vicinal surface and an offcut ranging from 2° to 15° inclusive;

applying the semiconductor body onto the substrate in layers, wherein the semiconductor body comprises a plurality of sublayers formed in a terrace structure manner on the substrate and comprises the plurality of internal steps;

applying the current expansion layer onto the semiconductor body; and applying the contact structure having the conductor tracks on the current expansion layer, wherein the conductor tracks are applied to the current expansion layer using a mask.

16. The method according to claim 15, wherein the mask is formed from a photo-structurable material and the conductor tracks are applied onto the current expansion layer in a structured manner using the mask.

17. The method according to claim 15, wherein the application of the current expansion layer occurs after the substrate has been removed from the semiconductor body, wherein the current expansion layer is applied onto a surface of the semiconductor chip exposed by the removal of the substrate.

* * * * *

UNITED STATES PATENT AND TRADEMARK OFFICE
CERTIFICATE OF CORRECTION

Page 1 of 1

PATENT NO. : 11,031,526 B2
APPLICATION NO. : 16/624312
DATED : June 8, 2021
INVENTOR(S) : Alexander Tonkikh It is certified that error appears in the above-identified patent and that said Letters Patent is hereby corrected as shown below:

In the Claims

Column 14, Lines 3-4, Claim 15; please change "a terrace structure manner" to --a terrace structure--

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*